United States Patent
Kim et al.

(10) Patent No.: US 10,693,040 B2
(45) Date of Patent: Jun. 23, 2020

(54) LIGHT EMITTING DEVICE AND LIGHT EMITTING DEVICE PACKAGE

(71) Applicant: SAMSUNG ELECTRONICS CO., LTD., Suwon-si (KR)

(72) Inventors: Tae Bae Kim, Hwaseong-si (KR); Sang Kyun Im, Seoul (KR); Hyun Kyung Kim, Yongin-si (KR); Young Hun Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/104,405

(22) Filed: Aug. 17, 2018

(65) Prior Publication Data
US 2019/0058089 A1 Feb. 21, 2019

(30) Foreign Application Priority Data
Aug. 18, 2017 (KR) .......................... 10-2017-0104625

(51) Int. Cl.
*H01L 33/00* (2010.01)
*H01L 33/32* (2010.01)
*H01L 33/62* (2010.01)
*H01L 33/48* (2010.01)

(52) U.S. Cl.
CPC ............ *H01L 33/32* (2013.01); *H01L 33/486* (2013.01); *H01L 33/62* (2013.01)

(58) Field of Classification Search
CPC ......... H01L 33/16; H01L 33/32; H01L 33/60; H01L 33/62; H01L 33/486

USPC .................................................. 257/98–100
See application file for complete search history.

(56) References Cited

U.S. PATENT DOCUMENTS

| 5,557,115 | A | * | 9/1996 | Shakuda ............... H01L 33/007 257/680 |
| 8,399,877 | B2 | | 3/2013 | Jeong |
| 2002/0117103 | A1 | * | 8/2002 | Hooper .................. C30B 23/02 117/84 |
| 2003/0209714 | A1 | * | 11/2003 | Taskar ................. H01L 33/105 257/79 |
| 2008/0093593 | A1 | | 4/2008 | Ryu |

(Continued)

FOREIGN PATENT DOCUMENTS

| JP | 2007-532933 A | 11/2007 |
| JP | 2014-090169 A | 5/2014 |

(Continued)

OTHER PUBLICATIONS

International Search Report and Written Opinion of the International Searching Authority or the declaration in corresponding International Application No. PCT/KR2018/009411, dated Dec. 12, 2018 (PCT/ISA/220).

(Continued)

*Primary Examiner* — Brook Kebede
(74) *Attorney, Agent, or Firm* — Sughrue Mion, PLLC

(57) ABSTRACT

A light emitting device includes a semiconductor layer, and a light emitting layer disposed in the semiconductor layer and having a composition ratio of $Ga_{(1-x)}In_xN$. x is greater than 0.14 but less than 0.16 to emit a green light from the light emitting layer, or greater than 0.22 but less than 0.26 to emit a blue light from the light emitting layer.

11 Claims, 4 Drawing Sheets

(56) References Cited

U.S. PATENT DOCUMENTS

| | | | |
|---|---|---|---|
| 2012/0018764 A1 | 1/2012 | Choi et al. | |
| 2014/0042468 A1* | 2/2014 | Inoue | H01L 33/60 257/88 |
| 2015/0349225 A1 | 12/2015 | Oh et al. | |
| 2016/0005917 A1 | 1/2016 | Jung et al. | |

FOREIGN PATENT DOCUMENTS

| | | |
|---|---|---|
| KR | 10-1005320 B1 | 1/2011 |
| KR | 10-2017-0082187 A | 7/2017 |

OTHER PUBLICATIONS

Written Opinion (PCT/ISA/237) issued by the International Searching Authority in corresponding International Application No. PCT/KR2018/009411, dated Dec. 12, 2018.

International Search Report (PCT/ISA/210), issued by International Searching Authority in corresponding International Application No. PCT/KR2018/009411, dated Dec. 12, 2018.

* cited by examiner

LIGHT EMITTING DEVICE AND LIGHT EMITTING DEVICE PACKAGE

CROSS-REFERENCE TO RELATED APPLICATION

This application is based on and claims priority under 35 U.S.C. § 119 to Korean Patent Application No. 10-2017-0104625, filed on Aug. 18, 2017, in the Korean Intellectual Property Office, the disclosures of which are incorporated by reference in its entirety.

BACKGROUND

1. Field

The disclosure relates to a light emitting device and a light emitting device package.

2. Description of the Related Art

DCI-P3 is a common RGB color space for digital movie projection in the U.S. film industry. In CIE 1931 xy chromaticity diagram, the DCI-P3 color space covers 45.5% of all chromaticities and 86.9% of Pointer's gamut.

Currently, many theaters use digital cinema projectors to screen movies. To satisfy a DCI-P3 reference, a light source of a digital cinema projector has been implemented to be a xenon lamp.

The xenon lamp must be replaced every few months, has difficulty in screening movies with a given brightness or higher, and cannot implement a High Dynamic Range (HDR) function capable of raising brightness of an image part by 5 to 10 times (70 to 150 fl).

SUMMARY

Provided are a light emitting device adjusting a composition ratio of components included in a light emitting layer of the light emitting device in a manner that light emitted from a light emitting device satisfies a DCI-P3 reference, and a light emitting device package.

Additional aspects will be set forth in part in the description that follows and, in part, will be apparent from the description, or may be learned by practice of the presented embodiments.

In accordance with an aspect of the disclosure, a light emitting device includes a semiconductor layer, and a light emitting layer disposed in the semiconductor layer and having a composition ratio of $Ga_{(1-x)}In_xN$. x is greater than 0.14 but less than 0.16 to emit a blue light from the light emitting layer, or greater than 0.22 but less than 0.26 to emit a green light from the light emitting layer.

The light emitting layer may emit the blue light having a wavelength band in a range of 461 to 466 nm, when x is greater than 0.14 but less than 0.16 1.

The light emitting layer may emit the green light having a wavelength band in a range of 540 to 545 nm, when x is greater than 0.22 but less than 0.26.

In accordance with an aspect of the disclosure, a light emitting device package includes a body frame in which a cavity is disposed, and a light emitting device disposed in the cavity and on the body frame. The light emitting device includes a light emitting layer having a composition ratio of $Ga_{(1-x)}In_xN$, and x is greater than 0.14 but less than 0.16 to emit a blue light from the light emitting layer, or greater than 0.22 but less than 0.26 to emit a green light from the light emitting layer.

The light emitting layer may emit the blue light having a wavelength band in a range of 461 to 466 nm, when x is greater than 0.14 but less than 0.16 1.

The light emitting layer may emit the green light having a wavelength band in a range of 540 to 545 nm, when x is greater than 0.22 but less than 0.26.

The light emitting device package may further include a plurality of light emitting devices disposed in the cavity and on the body frame.

In accordance with an aspect of the disclosure, a light emitting device includes a substrate, a first semiconductor layer disposed on the substrate, a light emitting layer disposed on the first semiconductor layer, and a second semiconductor layer disposed on the light emitting layer. The light emitting layer includes $Ga_{(1-x)}In_xN$, and x is greater than 0.14 but less than 0.16 to emit a blue light from the light emitting layer, or greater than 0.22 but less than 0.26 to emit a green light from the light emitting layer.

The light emitting layer may emit the blue light having a wavelength band in a range of 461 to 466 nm, when x is greater than 0.14 but less than 0.16 1.

The light emitting layer may emit the green light having a wavelength band in a range of 540 to 545 nm, when x is greater than 0.22 but less than 0.26.

The first semiconductor layer may be of an N-type, and the second semiconductor layer may be of a P-type.

The light emitting device may further include an N-type electrode disposed on the first semiconductor layer and connected to a first lead frame, and a P-type electrode disposed on the second semiconductor layer and connected to a second lead frame.

The light emitting device may further include an adhesive layer interposed between the N-type electrode and the first lead frame.

The light emitting device may further include an adhesive layer interposed between the P-type electrode and the second lead frame.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
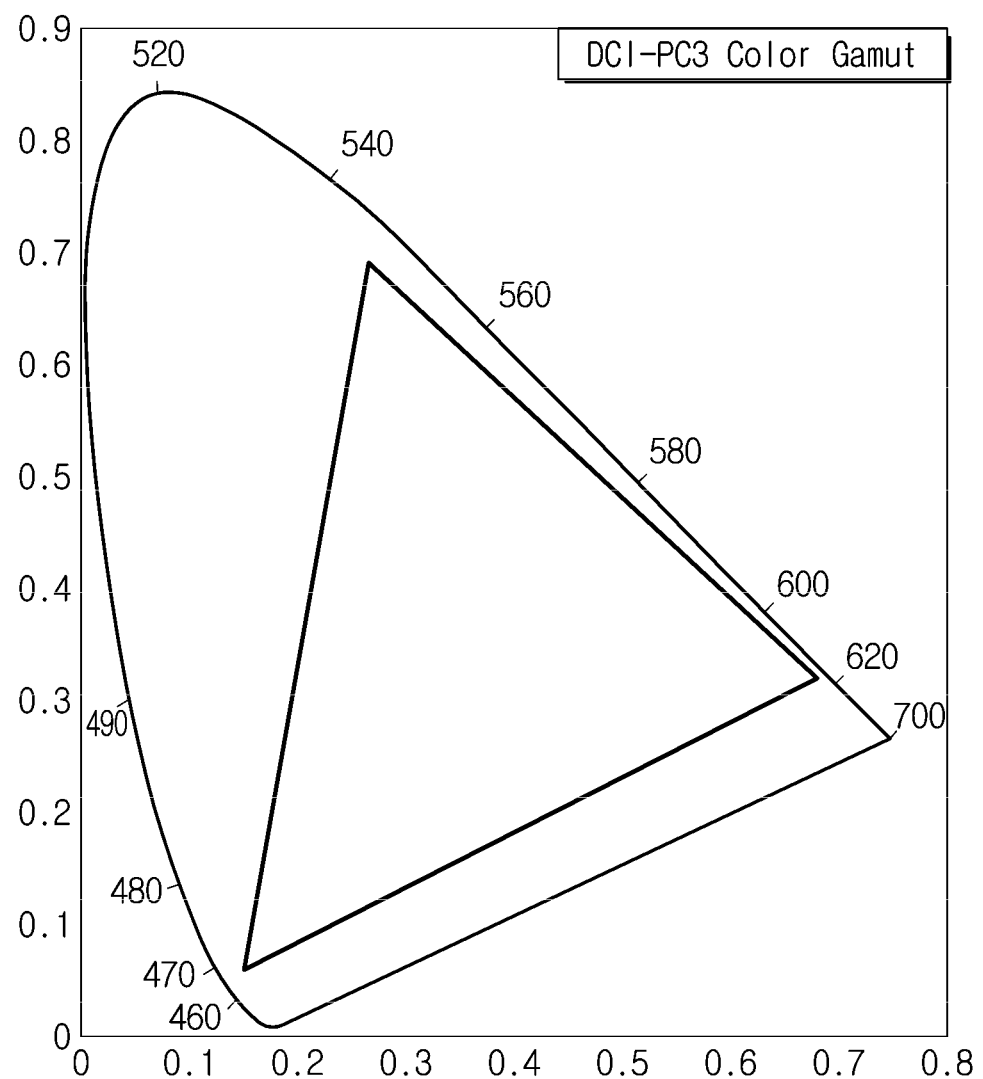
FIG. 1 is a view illustrating a DCI-P3 color gamut according to an embodiment.

Like numerals refer to like elements throughout the specification. Not all elements of embodiments of the disclosure will be described, and description of what are commonly known in the art or what overlap each other in the embodiments will be omitted. The terms as used throughout the specification, such as "~ part," "~ module," "~ member," "~ block," etc., may be implemented in software and/or hardware, and a plurality of "~ parts," "~ modules," "~ members," or "~ blocks" may be implemented in a single element, or a single "~ part," "~ module," "~ member," or "~ block" may include a plurality of elements.

It will be further understood that the term "connect" or its derivatives refer both to direct and indirect connection, and the indirect connection includes a connection over a wireless communication network.

The term "include (or including)" or "comprise (or comprising)" is inclusive or open-ended and does not exclude additional, unrecited elements or method steps, unless otherwise mentioned.

It will be understood that, although the terms first, second, third, etc., may be used herein to describe various elements, components, regions, layers and/or sections, these elements, components, regions, layers and/or sections may not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are merely used for convenience of explanation, but not to limit an order of the steps. Thus, unless the context clearly dictates otherwise, the written order may be practiced otherwise.

A light emitting device and a light emitting device package according to the embodiments of the disclosure will hereinafter be described with reference to the attached drawings.

A light emitting device and a light emitting device package according to the embodiments of the disclosure may provide a display apparatus for movie screening, and a composition ratio of components included in a light emitting layer of the light emitting device may be adjusted to satisfy the DCI-P3 reference.

For convenience of description and better understanding of the disclosure, the DCI-P3 reference to be implemented by the light emitting device and the light emitting device package will hereinafter be described.

FIG. 1 is a view illustrating a DCI-P3 color gamut according to an embodiment. Color coordinates of the DCI-P3 Color Gamut are shown in the following Table 1.

TABLE 1

| Categories | DCI-P3 Color Gamut | |
|---|---|---|
| Color Coordinates | DCI-P3_x | DCI-P3_y |
| Red(R) | 0.680 | 0.320 |
| Green(G) | 0.265 | 0.690 |
| Blue(B) | 0.150 | 0.060 |

The light emitting device and the light emitting device package according to the disclosure aims to satisfy the DCI-P3 color gamut reference shown in FIG. 1 and Table 1. In other words, light generated by the light emitting device and the light emitting device package aims to cover the region composed of Red(R)(0.680, 0.320), Green(G)(0.265, 0.690), and Blue(B)(0.150, 0.060) in CIE 1931 color coordinates.

To this end, the disclosure may provide a cinema light emitting device having specifications shown in the following Table 2 in individual color regions, and the light emitting device package and the display apparatus including the same.

TABLE 2

| LED color | Wavelength | Conditions |
|---|---|---|
| Red | 618~623 nm | Driving current basis, |
| Green | 540~545 nm | Brightness Range 14~146 fl |
| Blue | 461~466 nm | (48 nit~500 nit) |

The light emitting device and the light emitting device package according to the disclosure may adjust the types and the composition ratio of the components included in the light emitting layer of the light emitting device, thereby satisfying the DCI-P3 reference.

Embodiments of the disclosure will hereinafter be described with reference to the attached drawings. The light emitting device according to the disclosed disclosure may be provided in a package form. Hereinafter, embodiments of the disclosure will be described by way of example in which the light emitting device is provided in the form of the light emitting device package to facilitate understanding.

Figure 2:
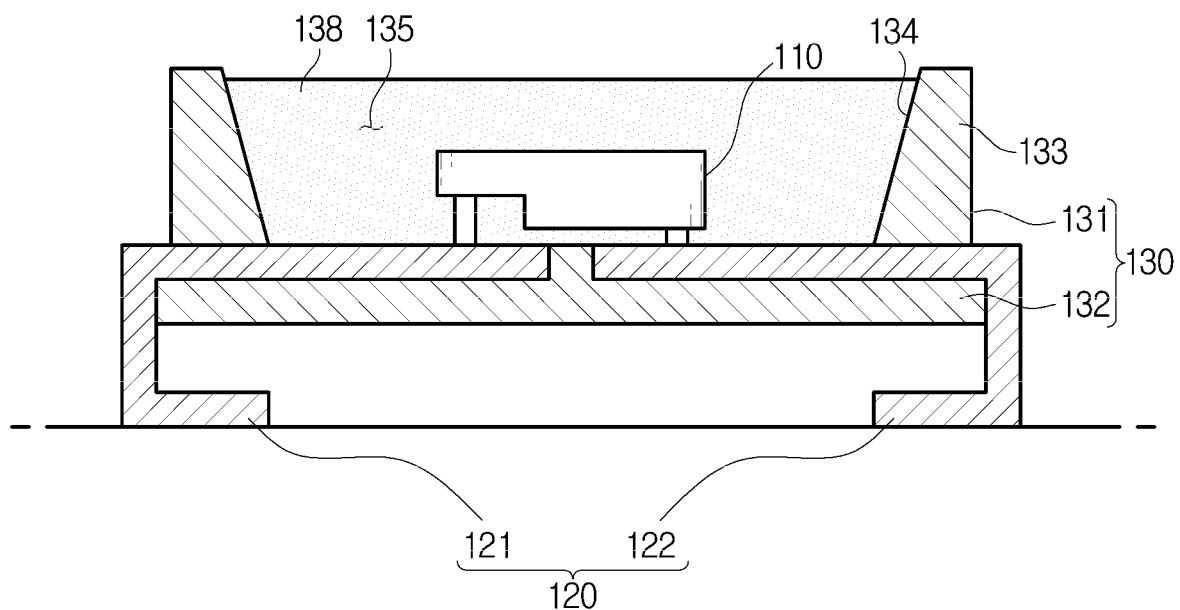
FIG. 2 is a cross-sectional view illustrating a light emitting device package according to an embodiment.
Figure 3:
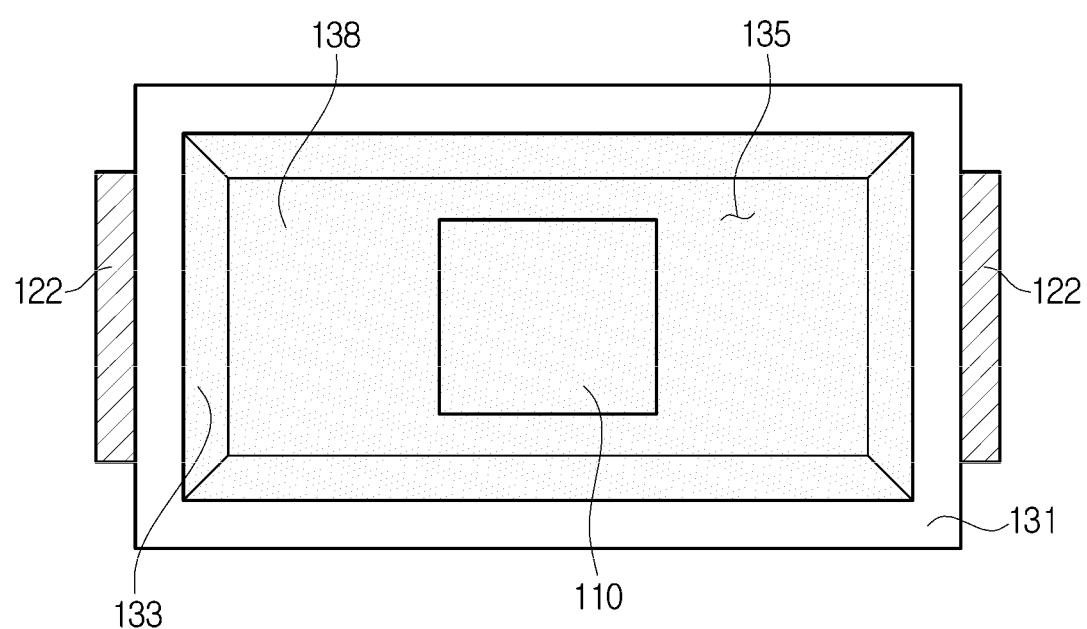
FIG. 3 is a plan view illustrating the light emitting device package shown in FIG. 2.

FIG. 2 is a cross-sectional view illustrating a light emitting device package 100 according to an embodiment. FIG. 3 is a plan view illustrating the light emitting device package 100 shown in FIG. 2.

Referring to FIGS. 2 and 3, the light emitting device package 100 may include a light emitting device 110 to generate light, a lead frame 120 electrically connected to the light emitting device 110 to form at least one region located at a bottom surface of a cavity 135, and a body frame 130 provided with the cavity 135 to accommodate the light emitting device 110 therein.

The light emitting device 110 may include all kinds of structures capable of generating light. For example, the light emitting device 110 may include at least one light emitting diode.

The light emitting diode may have a stacked compound semiconductor including a PN junction structure, and may include an N-type semiconductor layer, a P-type semiconductor layer, and a light emitting layer disposed between the N-type semiconductor layer and the P-type semiconductor layer.

In the light emitting diode, electrons and holes may be injected into the light emitting layer when forward electric field is applied to the N-type semiconductor layer and the P-type semiconductor layer, and the electrons and holes injected into the light emitting layer are recombined to emit light, such that the light emitting device may generate and emit the light.

The light emitting device 110 may emit monochromatic light of a red(R), green(G), or blue(B) wavelength band. The disclosure aims to provide a light emitting device package 100 matched with the DPI-P3 reference by converting a color region of the monochromatic light having the green(G) wavelength band and a color region of the monochromatic light having the blue(B) wavelength band. The embodiments of the disclosure will hereinafter be described using an example case in which the light emitting device package 100 includes the light emitting device 110 configured to emit monochromatic light having the green(G) wavelength band and monochromatic light having the blue(B) wavelength band.

The light emitting diode may be broadly classified into a laterally structured light emitting diode and a vertically structured light emitting diode. The laterally structured light emitting diode may be classified into a top-emitting light emitting diode and a flip-chip light emitting diode.

The flip-chip light emitting diode may be formed to emit light through a sapphire substrate. The light emitting diode may be die-attached to a submount (for example, a lead frame 120), and light generated by the light emitting diode may be emitted through one surface of the diode that is not die-attached to the submount.

The light emitting device 110 will hereinafter be described using the flip-chip light emitting diode as an example.

Figure 4:
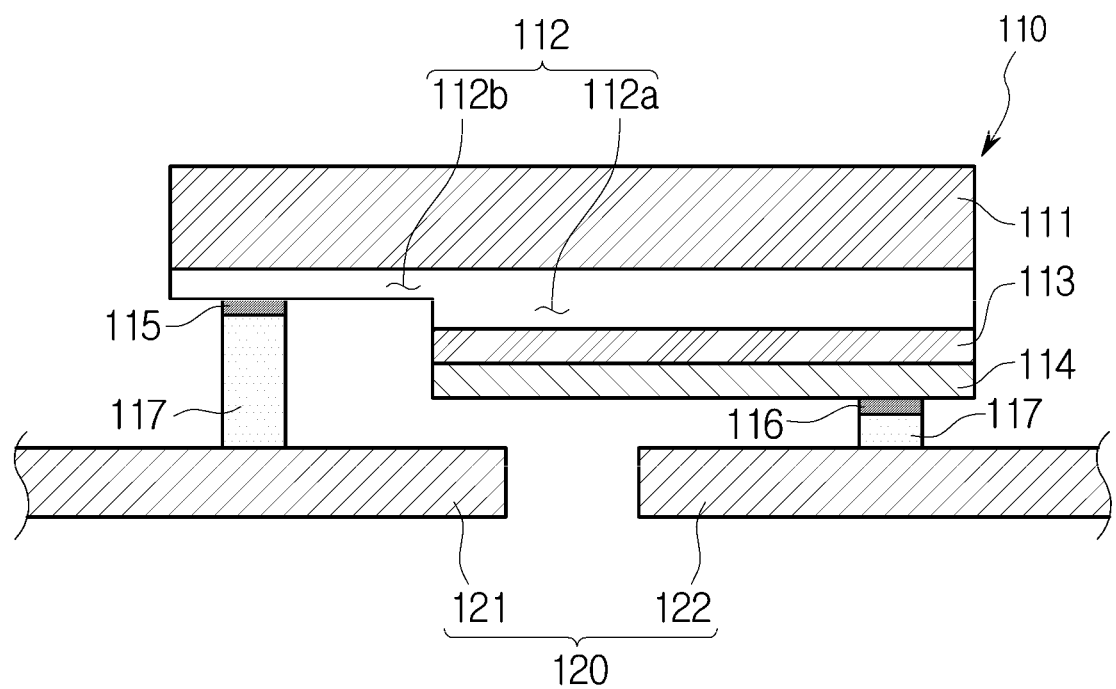
FIG. 4 is a cross-sectional view illustrating a light emitting device according to an embodiment.

FIG. 4 is a cross-sectional view illustrating the light emitting device 110 according to an embodiment.

Referring to FIG. 4, the light emitting device 110 may have a sequentially stacked structure of a substrate 111, an N-type semiconductor layer 112, a light emitting layer 113, and a P-type semiconductor layer 114.

The substrate 111 may be formed of a transparent material having sapphire. The substrate 111 may be formed of sapphire, and may also be formed of zinc oxide (ZnO), gallium nitride (GaN), silicon carbide (SiC), aluminum nitride (AlN), etc.

A buffer layer may be formed between the substrate 111 and the N-type semiconductor layer 112. The buffer layer may be configured to improve lattice matching with the substrate 111 before the N-type semiconductor layer 112 is grown on the substrate 111, and the buffer layer may be omitted according to fabrication conditions and element characteristics.

The N-type semiconductor layer 112 may be formed of a semiconductor material having the formula $In_xAl_yGa_{(1-x-y)}N$ (where $0 \leq X$, $0 \leq Y$, $X+Y \leq 1$). The N-type semiconductor layer 112 may be formed of a GaN or GaN/AlGaN layer doped with N-type conductive impurities. For example, the N-type conductive impurities may be formed of silicon (Si), germanium (Ge), tin (Sn), etc.

The N-type semiconductor layer 112 may be classified into a first region 112a and a second region 112b. The first region 112a may be used to define a light emitting surface. To improve optical characteristics of the light emitting device 110, the first region 112a may be larger in size than the second region 112b.

The light emitting layer 113 and the P-type semiconductor layer 114 are sequentially stacked in the first region 112a, thereby forming a light emitting structure.

The light emitting layer 113 may be provided as a multi-quantum well structure including InN and GaN components. The wavelength of the light emitting layer 113 may be determined according to the composition ratio of InN and GaN included in the light emitting layer 113 to emit green light or blue light.

The light emitting layer 113 may be provided with the following Formula 1 and Table 3 components to emit light.

$Ga_{(1-x)}In_xN$  [Formula 1]

TABLE 3

| Light emitting device color | Composition ratio of $Ga_{(1-x)}In_xN$ in light emitting layer |
|---|---|
| Green | 0.220 < x < 0.260 |
| Blue | 0.140 < x < 0.160 |

That is, in the Formula 1, x is greater than 0.14 but less than 0.16, and greater than 0.22 but less than 0.26.

Referring to the Table 3, when x is greater than 0.14 but less than 0.16 in the Formula 1, the blue light having a wavelength band in a range of 461 to 466 nm may be generated in the light emitting layer 112. In the Formula 1, when x is greater than 0.22 but less than 0.26, the green light having the wavelength band of 540 to 545 nm may be generated in the light emitting layer 112.

The composition ratio of the $Ga_{(1-x)}In_xN$ forming the light emitting layer 112 may be experimentally determined within the range to satisfy the DCI-P3 reference, and the ratio of the blue light to the green light may be adjusted by controlling the composition ratio of the GaN and the InN within the range satisfying the above numerical range.

The P-type semiconductor layer 114 may be formed of a semiconductor material having formula $In_xAl_yGa_{(1-x-y)}N$ (where $0 \leq X$, $0 \leq Y$, $X+Y \leq 1$). The P-type semiconductor layer 114 may be formed of a GaN or GaN/AlGaN layer doped with P-type conductive impurities. For example, the P-type conductive impurities may be formed of magnesium (Mg), zinc (Zn), beryllium (Be), etc.

An N-type electrode 115 may be formed over the N-type semiconductor layer 112, and a P-type electrode 116 may be formed over the P-type semiconductor layer 114.

An adhesive layer 117 may be formed of a stacked structure of a plurality of metal layers, each of which includes a single element. To prevent reflectance of the lead frame 120 from affecting characteristics of the light emitting device 110, the adhesive layer 117 may include a reflective material. For example, the adhesive layer 117 may be formed of a metal having tin (Sn) or silver (Ag).

Although the N-type semiconductor layer 112 formed at an upper part of the LED package and the P-type semiconductor layer 114 formed at a lower part of the LED package are shown in FIG. 3 for convenience of description and better understanding of the disclosure, it may be noted that the P-type semiconductor layer 114 may be formed at the upper part of the LED package and the N-type semiconductor layer 112 may be formed at the lower part of the LED package.

One or more light emitting devices 110 may be mounted on the light emitting device package 100. For example, this embodiment has disclosed an example case in which only one light emitting device 110 is mounted on the light emitting device package 100.

The lead frame 120 may reflect light generated by the light emitting device 110 by forming the bottom surface of the cavity 135, and may provide the light emitting device 110 with external power.

The lead frame 120 may be formed to have a monolayer structure or a multilayer structure. As shown in FIG. 4, two lead frames 120 or multiple lead frames 120 may be used.

For convenience of description and better understanding of the disclosure, the lead frame 120 may have a monolayer structure, and the lead frame 120 may include a first lead frame 121 and a second lead frame 122. Referring to FIGS. 2 and 3, one side of the first lead frame 121 and one side of the second lead frame 122 may be inserted between an upper body frame 131 and a lower body frame 132, and the other side of the first lead frame 121 and the other side of the second lead frame 122 may be formed to enclose the lower body frame 132.

The light emitting device 110 may be attached to an upper part of the first lead frame 121 or the second lead frame 122, or may be attached over the first lead frame 121 and the second lead frame 122.

When the light emitting device 110 is attached to the upper part of the first lead frame 121 or the second lead frame 122, the light emitting device 110 may be electrically connected to the second lead frame 122 or the first lead frame 121 through wire bonding. When the light emitting device 110 is attached over the first lead frame 121 and the second lead frame 122, the light emitting device 110 may be attached to the top surface of each lead frame 120 through the adhesive layer 117. The example case in which the light emitting device 110 is attached to the lead frame 120 through the adhesive layer 117 has been illustrated in FIGS. 2-4.

The lead frame 120 may include at least one selected from a group that includes titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), and iron (Fe).

The first lead frame 121 and the second lead frame 122 may be spaced apart from each other, such that the first lead frame 121 and the second lead frame 122 may be electrically isolated from each other. Each read frame 120 may form at least one region located at the bottom surface of the cavity 135.

Referring back to FIGS. 2 and 3, the body frame 130 may support and protect the light emitting device 110, and may include the upper body frame 131 and the lower body frame 132.

The body frame 130 may be formed of any one or any combination of a resin such as polyphthalamide (PPA), silicon (Si), aluminum (Al), aluminum nitride (AlN), photosensitive glass (PSG), polyamide 9T (PA9T), syndiotactic polystyrene (SPS), metal, sapphire ($Al_2O_3$), and beryllium oxide (BeO).

Although the body frame 130 may be formed by injection molding, etching process, etc., the scope or spirit of the body frame 130 is not limited thereto.

The upper body frame 131 may be formed to be concave in a manner that a diameter thereof is gradually reduced in the range from an upper part to a lower part thereof, and may have the cavity 135 through which the lead frame 120 is exposed. Although the cavity 135 may be larger in width and height than the light emitting device 110, the scope or spirit of the disclosure is not limited thereto.

The upper body 131 may include a wall part 133 enclosing the plurality of cavities 135. An inner surface 134 of the wall part 133 may be formed to have a tilted surface. A reflective angle of light emitted from the light emitting device 110 may be changed according to an angle of the tilted surface, such that a directional angle of the light emitted outside can be adjusted. The lower the directional angle of light, the higher the concentration of light emitted outside. In contrast, the higher the directional angle of light, the lower the concentration of light emitted from the light emitting device 110.

The cavity 135 may be filled with a molding material 138 that protects the light emitting device from the outside by enclosing the light emitting device. The cavity 135 may be filled with the molding material 138 to cover a side of the light emitting device 110, such that the molding material 138 may isolate the light emitting device 110 from the outside to protect the light emitting device from external invasive material or the like.

The molding material 138 filling the cavity 135 may be formed to be concave in the range from the upper part to the lower part thereof, and may also be formed to have a planar shape or a convex shape. When the upper part of the molding material 138 is formed to be concave, the directional angle of light emitted outside may decrease and concentration of light may increase. When the upper part of the molding material 138 is formed to have a convex shape, the directional angle of light emitted outside may increase and concentration of light may decrease.

The molding material 138 may be formed of silicon epoxy or another resin material that has superior watertightness, superior corrosion resistance, and superior insulation characteristics, and may be formed using ultraviolet (UV) light or thermosetting characteristics.

The molding material 138 may further include a light diffusion material for scattering light generated by the light emitting device 110.

A light scattering material may be formed in metal particles. If the light scattering material is formed of metal, light extraction efficiency of the light emitting device package 100 may increase through surface plasmon resonance. Plasmon waves excited and formed by light have characteristics in that the plasmon waves are not propagated from a flat surface of a metal layer to the inside or outside. To emit surface plasmon waves to the outside using light, the light scattering material may have a spherical shape.

To this end, the metal constructing the light scattering material may be formed of any one or any combination of gold (Au), silver (Ag), copper (Cu), and aluminum (Al), each of which easily emits electrons by external stimulus and has a negative (−) dielectric constant.

The light emitting device 110 and the light emitting device package 100 according to the embodiment of the disclosure has been disclosed as described above.

The light emitting device 110 and the light emitting device package 100 according to the disclosed disclosure may provide the display apparatus for a theater satisfying the DCI-P3 reference.

The light emitting device 110 and the light emitting device package 100 according to the disclosed disclosure may form a cabinet by combining a plurality of light emitting devices 110 or the light emitting device packages 100. Although the cabinet may be fabricated to have a horizontal size of about 1 to 2 meters and a vertical size of about 0.5 to 1 meters, the scope or spirit of the disclosure is not limited thereto.

The plurality of cabinets may be interconnected to provide a large screen. That is, several cabinets may be interconnected to construct a 2 K (FHD: Full HD) screen and a 4 K (UHD: Ultra HD) screen, such that the 2 K screen or 4 K screen may be installed in places (e.g., theaters) that require large screens.

The light emitting device 110 and the light emitting device package 100 according to the disclosure may provide large screens that implement colors and definition satisfying the DCI-P3 reference, such that the large screens may substitute for conventional projectors and screens used in theaters.

The structure of the light emitting device 110 and the light emitting device package 100 according to an embodiment has been described above. It is to be understood that the technical idea of the disclosure is not limited by the examples described above and may be broadly construed as a concept including changes within a range that can be easily conceived by those skilled in the art.

As is apparent from the above description, the embodiments of the disclosure may provide the light emitting device package optimized to allow the color region of the light emitting device to satisfy the DCI-P3 reference by adjusting the composition ratio of the components included in the light emitting layer of the light emitting device. As a result, the embodiments of the disclosure may provide a display apparatus that implements the best color and sharpness satisfying DCI-P3 reference without using the conventional projectors and screens used in theaters. Furthermore, by not using a lamp that is a disadvantage of the conventional projectors, the embodiments of the disclosure may provide the display apparatus that is environmentally friendly and can be used for a long time.

Although a few embodiments of the disclosure have been shown and described, it would be appreciated by those skilled in the art that changes may be made in these embodiments without departing from the principles and spirit of the inventive concepts, the scope of which is defined in the claims and their equivalents.

What is claimed is:

1. A light emitting device comprising:
   a semiconductor layer; and
   a light emitting layer disposed in the semiconductor layer and having a composition ratio of $Ga_{(1-x)}In_xN$,
   wherein x is greater than 0.22 but less than 0.26 to emit a green light satisfying a DCI-P3 reference, from the light emitting layer.

2. The light emitting device according to claim 1, wherein the light emitting layer emits the green light having a wavelength band in a range of 540 to 545 nm, when x is greater than 0.22 but less than 0.26.

3. A light emitting device package comprising:
   a body frame in which a cavity is disposed;
   a light emitting device disposed in the cavity and on the body frame,
   wherein the light emitting device comprises a light emitting layer having a composition ratio of $Ga_{(1-x)}In_xN$, and
   wherein x is greater than 0.22 but less than 0.26 to emit a green light satisfying a DCI-P3 reference, from the light emitting layer.

4. The light emitting device package according to claim 3, wherein the light emitting layer emits the green light having a wavelength band in a range of 540 to 545 nm, when x is greater than 0.22 but less than 0.26.

5. The light emitting device package according to claim 3, further comprising a plurality of light emitting devices disposed in the cavity and on the body frame.

6. A light emitting device comprising:
   a substrate;
   a first semiconductor layer disposed on the substrate;
   a light emitting layer disposed on the first semiconductor layer; and
   a second semiconductor layer disposed on the light emitting layer,
   wherein the light emitting layer comprises $Ga_{(1-x)}In_xN$, and
   wherein x is greater than 0.22 but less than 0.26 to emit a green light satisfying a DCI-P3 reference, from the light emitting layer.

7. The light emitting device according to claim 6, wherein the light emitting layer emits the green light having a wavelength band in a range of 540 to 545 nm, when x is greater than 0.22 but less than 0.26.

8. The light emitting device according to claim 6, wherein the first semiconductor layer is of an N-type, and
   the second semiconductor layer is of a P-type.

9. The light emitting device according to claim 8, further comprising:
   an N-type electrode disposed on the first semiconductor layer and connected to a first lead frame; and
   a P-type electrode disposed on the second semiconductor layer and connected to a second lead frame.

10. The light emitting device according to claim 9, further comprising an adhesive layer interposed between the N-type electrode and the first lead frame.

11. The light emitting device according to claim 9, further comprising an adhesive layer interposed between the P-type electrode and the second lead frame.

* * * * *